United States Patent [19]

Hughes et al.

[11] 4,064,558

[45] Dec. 20, 1977

[54] METHOD AND APPARATUS FOR RANDOMIZING MEMORY SITE USAGE

[75] Inventors: William C. Hughes, Scotia; Wayne B. Nelson; George E. Possin, both of Schenectady, all of N.Y.

[73] Assignee: General Electric Company, Schenectady, N.Y.

[21] Appl. No.: 734,767

[22] Filed: Oct. 22, 1976

[51] Int. Cl.² .............................................. G06F 7/00
[52] U.S. Cl. ..................................... 364/900; 365/230
[58] Field of Search ................ 340/173 CR, 173 RC, 340/173 R

[56] References Cited
U.S. PATENT DOCUMENTS

| 3,132,324 | 5/1964 | Estrems | 364/900 |
| 3,262,100 | 7/1966 | Bespalko et al. | 364/900 |
| 3,328,770 | 6/1967 | Silver | 364/900 |
| 3,810,112 | 5/1974 | Aho et al. | 364/900 |
| 3,943,347 | 3/1976 | Martinson | 364/900 |

*Primary Examiner*—Leo H. Boudreau
*Attorney, Agent, or Firm*—Geoffrey H. Krauss; Joseph T. Cohen; Jerome C. Squillaro

[57] ABSTRACT

A method for randomly scrambling the physical address of a block of data, within a memory subject to data site deterioration, by utilizing an auxiliary correspondence memory to pair each logical input/output address with a physical memory address at a random time. Apparatus for implementing the novel method is also disclosed.

25 Claims, 6 Drawing Figures

METHOD AND APPARATUS FOR RANDOMIZING MEMORY SITE USAGE

BACKGROUND OF THE INVENTION

The present invention relates to digital computer memory means and, more particularly, to a novel method and apparatus for randomly rotating a particular block of memorized data among a plurality of possible data site blocks to prevent undesirable data deterioration.

Known memory devices, such as the BEAMOS (BEam Addressed Metal Oxide Semiconductor) memory device, utilize a storage target, such as that disclosed in U.S. Pat. No. 3,761,895 to G. W. Ellis et al., issued Sept. 25, 1973 and assigned to the assignee of the present invention, which may be prone to at least two effects which may tend to reduce their data reliability when utilized in computer memory systems. These effects are: data site fatigue, defined as the permanently degraded performance of a data site (e.g., reduced signal output, reduced storage time, and so forth) after repeated usage of that data site; and adjacent site disturbance, defined as loss of information in a particular data storage site due to repeated accesses to other data sites in the memory. It should be understood that digital memories utilizing technologies including, but not limited to, MNOS (metal-nitride-oxide-semiconductor) transistors, thin film magnetic devices and charge storage memory devices may all suffer reduced data reliability from these or similar potential effects. A method, and apparatus implementing such novel method, for minimizing the effects of fatigue and adjacent site data disturbance in a memory (capable of having the data at any data bit site rewritten at electronic speeds responsive to external address and data stimuli) is extremely desirable.

BRIEF SUMMARY OF THE INVENTION

In accordance with the invention, a method for randomizing memory site usage in a rewritten memory device containing a plurality of data blocks each comprising a sequential plurality of data sites, includes the steps of pairing each logical address at the memory input/output port with a physical address of a block of data sites in the memory device itself; storing the pair of logical and physical addresses in an auxiliary correspondence memory; providing at least one temporary storage block at a randomly selected physical address, normally containing no data within the physical memory means; generating a random number for at least each write-data-in-memory command; and randomly moving the data contained at a presently-addressed physical address to the temporary storage data block of the memory device if the random number is equal to a previously selected number. The now-empty presently-addressed memory block becomes the new temporary-storage addressable physical address block. A next-logical address memory means contains the physical addresses of all possible addressable memory blocks in a well-scrambled order whereby physical addresses which are physically adjacent on a memory plane are well separated in the listing of data blocks for sequentially receiving the block of address data to be rotated. Thus, after a small number of accesses to the memory system, typically in the write-data mode, the data at the physical address corresponding to the current logical memory address is exchanged into the next physical address indicated by the auxiliary memory list and the list is incremented by one address to assure that the next exchangeable block of data moves to a physical position sufficiently far from the last-rewritten data block to minimmize adjacent site disturbance. This site rotation method assures a high degree of randomness in the distribution of access to the physical addresses of the system to minimize the number of consecutive writing operations at any data site (thereby minimizing site fatigue) while simultaneously minimizing adjacent site distrubance as hereinabove mentioned.

Apparatus for implementing the above novel method of reducing memory site deterioration by randomization, comprises a data buffer for temporarily storing data being exchanged; the aforementioned address correspondence and next-logical-address list memories, in addition to a data site management control means and pseudo-random number generating means for initiating the exchange operation, and a temporary address storage register means for use during relocation of a stored data sequence from one physical memory data block to another.

Accordingly, one object of the present invention is to provide a novel method for maximizing the data reliability of data stored in a re-writable data memory.

It is another object of the present invention to provide a novel method maximizing data reliability by randomization of memory site usage.

It is a further object of the present invention to provide novel apparatus for implementing the novel methods.

These and other objects of the present invention will become apparent upon a consideration of the following detailed description and the accompanying drawings.

DETAILED DESCRIPTION OF THE INVENTION

Figure 1A:
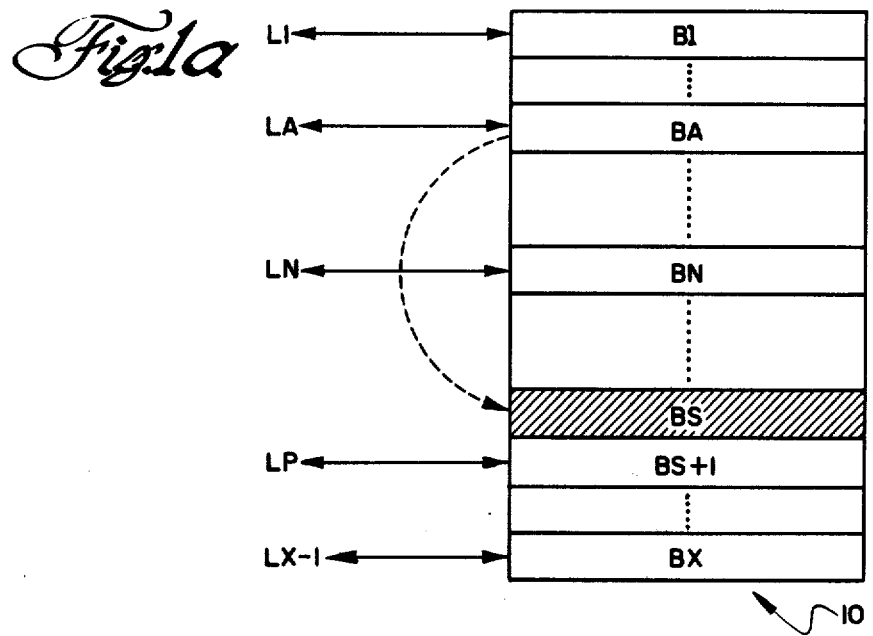
FIGS. 1a, 1b and 1c are block diagrams of a memory having a plurality of data block storage sites and illustrating a method of memory site usage randomization in accordance with the principles of the present invention.

Referring to FIGS. 1a, 1b, 1c and 2, a memory means 10 comprises storage media 12 (FIG. 2), such as a BEAMOS tube and the like, and a memory controller means 14 for accessing one of a plurality of data block storage sites in the storage medium The storage sites have physical addresses B1, . . . , BA, . . . , BN, . . . , BS, BS+1, . . . , BX for which physical addresses a set of input/output logical addresses L1, . . . , LA, . . . , LN, . . . , LP, . . . , LX−1 are initially established in one-to-one correspondence, leaving at least one physical address, e.g. BS, having no logical address and hence incapable of being accessed by means, such as an address register in a host computer 16 and the like, generating that one of the logical addresses L1 through LX at which data is sought to be stored (WRITTEN) or retrieved (READ). Each physical address BZ ($1 \leq Z \leq X$) is capable of storing a block of data of preselected size. Thus, each block may store a signal bit or byte of binary data, although storage of a relatively large block, e.g. at least $2^{10}$ bits, of sequential data is preferred. Typically, in a BEAMOS memory capable of storing approximately $34 \times 10^6 (=2^{25})$ bits, a block will be configured to accommodate $8192 (=2^{13})$ bits each, whereby $4096 (=2^{12})$ blocks exist in the memory tube (FIG. 2), each block being addressable by a unique 12 bit physical address code.

The list of correspondence between each logic address LY ($1 \leq Y \leq X-1$) and each physical address BZ is initially rstablished when a block of data is written into one of physical address blocks BZ responsive to the appropriate input-output logic address code LY being received from the controlling host computer means 16 (FIG. 2); at least one memory block, e.g. the block having a physical address BS, is assigned no corresponding logical address and is initially in an unwritten condition.

In an ideal memory, not subject to the adverse characteristics hereinabove mentioned, the initial correspondence between logical and physical addresses will be a permanent correspondence whereby data in any block BZ is always accessed by presentation of the corresponding logical address LZ to memory means 10. In a real memory, subject to at least some of the aforementioned disturbances, deterioration of stored data may occur after some finite number NF of writing and/or reading accesses to any selected physical address BZ, whereby deterioration of data stored thereat occurs.

In accordance with the invention, degradation of the stored data is minimized by generating a list of correspondence between the logical and physical addresses and by introducing random changes in the correspondence therebetween after a random number R of accesses to a presently addressed physical location BZ, where $R \leq F$, and F is preselected to be much less than NF (e.g. $R \leq F << NF$). Thus each access of a physical address block, e.g. BA, causes the generation of a random (or pseudorandom) number R ranging in value between 1 and F, inclusive. Generation of the number R not equal to F, for a particular access, causes the host computer-generated logic address, e.g. LA, to access the presently corresponding physical address, e.g. BA, while generation of a number F=N causes the data physically stored in block BA to be read from block BA and transferred to the previously unwritten temporary storage block BS (FIG. 1a) at essentially the same time as the data is received or transmitted to the host computer. During this exchange, the address correspondence list is modified to indicate correspondence of logic address LA with physical address BS. Subsequent addressing of the memory with logical address LA will access physical address BS, until the correspondence is again changed.

Figure 1B:
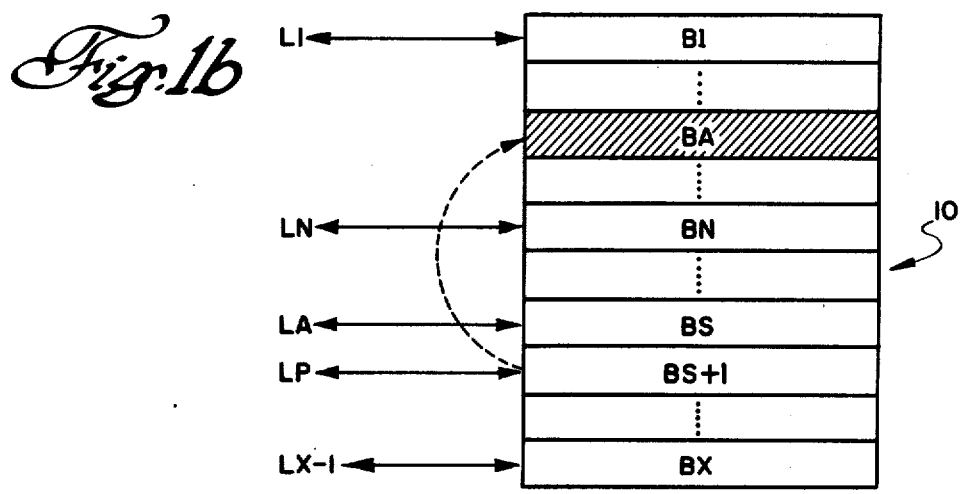
Figure 1C:
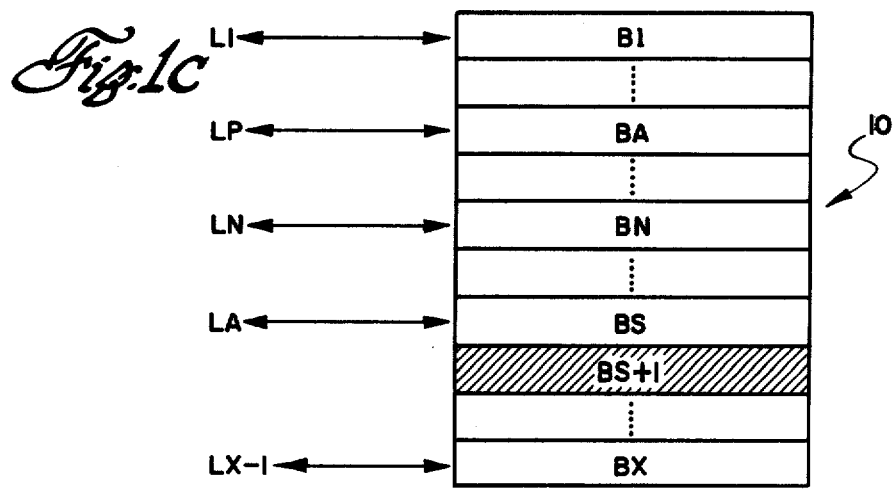

Physical address BA, which is a block of sequential data sites, is now in the unwritten state (FIG. 1b). The data site management control means then selects a next logical address, e.g. LP, and the block of data physically stored at the physical address BS+1, corresponding to the next logical address, LP, is exchanged into the now unwritten physical address BA, with suitable change in the list of correspondence between logical and physical addresses being carried out. Thus, logical address LP is now associated with physical address BA, now having a totally new data pattern written therein, while physical address block (BS+1) is now in the unwritten state and has no logical address corresponding thereto (FIG. 1c). Only upon completion of the block exchange is the host computer informed that the requested operation is completed and the memory is available for further access operations.

By similar random exchanges of data blocks between physically separated positions in the memory, deterioration of accessed and adjacent memory sites is minimized.

Figure 2:
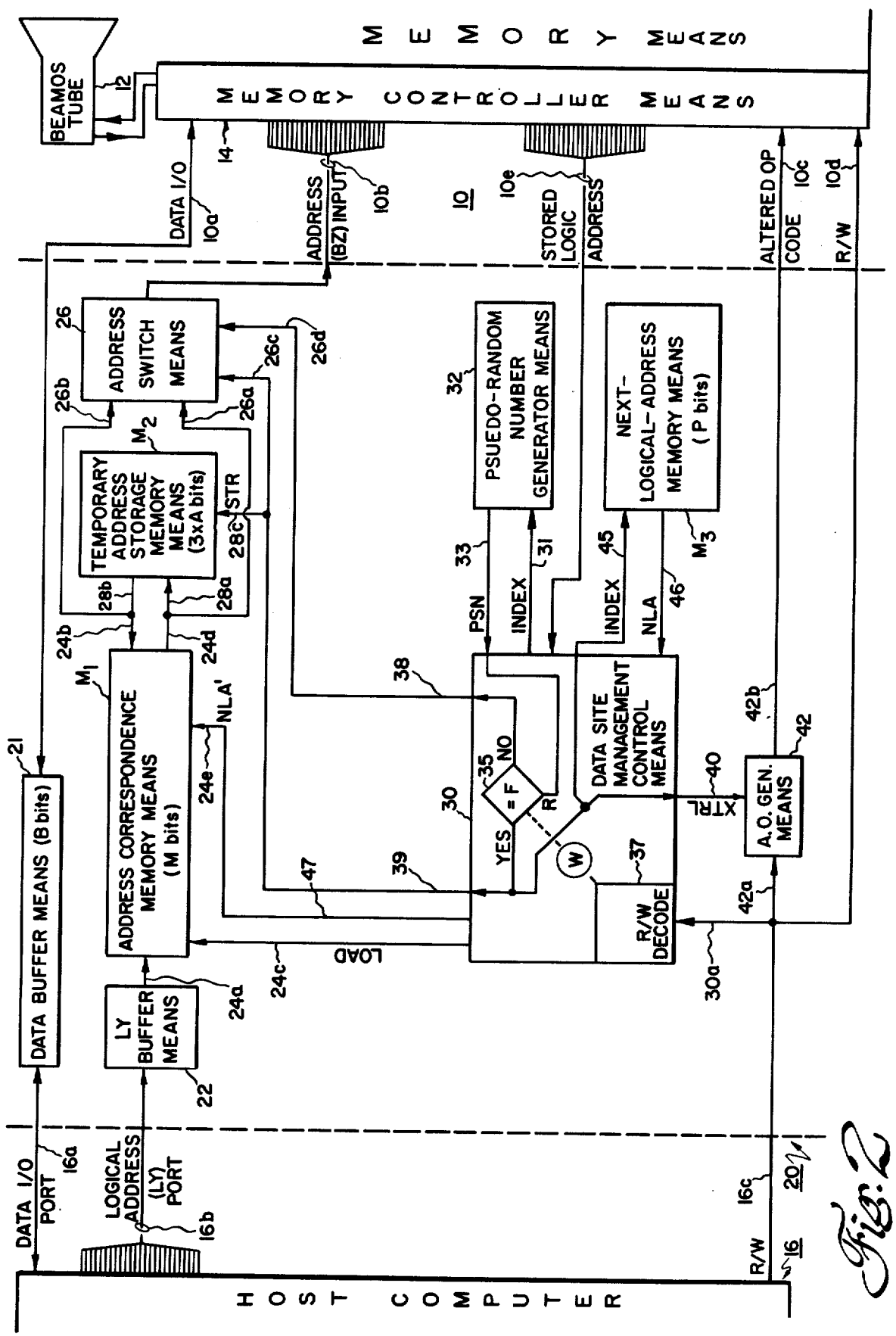
FIG. 2 is a schematic block diagram of apparatus for accomplishing the randomization of memory site usage in accordance with the principles of the present invention.

Referring now to FIG. 2, apparatus for implementing the novel random data block exchange method hereinabove described comprises randomizer means 20 connected between host computer 16 and the memory controller means 14. The randomizer means issues the necessary control signals to, and processes the data read from, the memory controller means 14. Randomizing means 20 includes a data buffer means 21, such as a shift register and the like, having a length of B bits, where B is the number of bits in a data block (being 8192 bits/block in the preferred embodiment). Data buffer means 21 may receive or transmit input data, via either a bidirectional data input/output (I/O) port 16a from the host computer or via a bidirectional data I/O line 10a from the memory controller means 14. Data buffer 21 may be utilized either for temporarily storing data during a site exchange operation or may temporarily hold a block of data output from one input entity (either the host computer or the memory means, respectively) until the remaining entity (the memory means or host computer, respectively), is ready to accept this data block.

The host computer 16 generates a multi-bit logical address code on lines 16b, which logic address code will, illustratively, be a 12 bit word where $2^{12}$ blocks of data can be accessed. A logical address buffer means 22 temporarily stores the logical address code for introduction thereof to the logic address input 24a of an address correspondence memory means $M_1$. Memory means $M_1$ has a capacity of M bits, with $M = (C/B) \times (\log_2 C/B)$ bits, with C being the total memory capacity in bits, e.g. $2^{25}$ bits, B being the minimum data block size in bits, e.g. $2^{13}$ bits/block and the quantity ($\log_2 C/B$) being rounded to the next highest integer, if the quantity (C/B) is an odd number. Thus, in the illustrated example, the address correspondence means $M_1$ must contain $M = (2^{12}) \times 12$ bits or 49152 bits, arranged in words of A bits each, where A is the number bits for a physical address, e.g. 12 bits, as utilized herein. Thus, memory means $M_1$, which may be comprised of 12 MOS memory chips of $4096 \times 1$ bits each, has the capacity to store a word for each block addressable in physical memory 10, which word consists of the necessary number of bits to generate the physical address on address (BZ) input line 10b to the memory controller means 14, and which word is a unique pattern of the bits on the A address lines. It should be understood that the number of logical address bits from host computer 16 need not be equal to the number of physical address bits presented to memory means 10, especially if a plurality of memory means are utilized with a single host computer, whereby several of the logical address bits are decoded and utilized to enable access to each selected corresponding one of the plurality of memory means, in manner known to the art. It should also be understood that other techniques, such as virtual addressing and the like, may be utilized to reduce the required number of storage bits in M, (and in $M_3$ hereinafter described).

Memory means $M_1$ includes an additional address input 24b and a load input 24c, a physical address output 24d coupled to one input 26a of an address switch means 26, as well as a new logical address (NLA') input 24e. Switch means 26 includes a second input 26b coupled to additional address input 24b, as well as a pair of control inputs 26c and 26d for controlling the coupling of the address bits at either input 26a or 26b to physical memory address input lines 10b, or, if neither of control inputs 26a and 26b are energized, for maintaining switch means 26 in an open condition whereby a physical address is not present to memory controller means 14.

A temporary address storage memory means $M_2$, capable of storing three address words, each having a length equal to the number A of bits required for addressing a physical address block via physical address input 10b, has a data input 28a coupled to memory means $M_1$ output 24d and address switch means input 26a; a data output 28b coupled to memory means $M_1$ input 24b and address switch means input 26b; and a strobe (STR) input 28c coupled to address switch means control input 26c.

A data site management control means 30 receives a read/write (R/W) control signal via line 16c from the host computer at a first input 30a. Generally each consecutive R/W command is detected within means 30 to generate an index signal on line 31 to a pseudorandom number generator means 32. Upon receipt of the index command, means 32 generates a new pseudorandom number (PSN) on an output line 33 for use as the random number R. Random number R is utilized as the input to a comparator block 35, within control means 30, and is compared to the selected number F, when comparator 35 is enabled by a R/W decode means 37. Comparator 35 generates a first, or NO, condition to energized a first control line 38 if $R \neq F$ and energizes a second, or YES, condition to energize a second control line 39 if $R = F$. Control line 38 is coupled to address switch means second input 26d, while control line 39 is coupled to address switch means first control input 26c, memory means $M_2$ STR input 28c and, via a separate control (XTRL) line 40 to an altered operation code generator (AO) means 42. AO means 42 receives the R/W command at its input 42a and, when both input 42a and XTRL line 40 are energized, generates an altered operations code at output 42b for introduction to memory 10 via line 10c, coincident with the occurrence of the R/W input on line 10d to the memory.

Data site management control means 30 also provides (in the $F=R$ condition) an index signal on line 45 to a next-logical-address memory means $M_3$. Memory means $M_3$ contains P bits organized in the same number of words as the total number of logical addresses premissible as inputs, on line 24a, to memory means $M_1$; each word contains the identical number of bits as each logical address at input 24a. Thus, if a single memory means 10 is utilized with the host computer, whereby the number of bits, e.g. 12, at the LY port 16b is equal to the number of bits at the memory address BZ input 10b, memory means $M_3$ will have the same number of bits ($P=M$) as address correspondence memory means $M_1$, which total number P of bits is subject to identical reduction if virtual addressing and like techniques are utilized with memory means $M_1$.

Memory means $M_3$ stores all possible logical addresses in some randomly scrambled order and, upon energization of index line 45, removes the previous logical address presented on line 46 (to control means 30) and transmits upon line 46 the next sequential logic address (NLA), which next logical address has a "random" relationship to the last presented address.

The operation of randomizer means 20 will now be described with reference to the use thereof with a memory means 10, containing a BEAMOS memory tube 12, which is to have its data blocks exchanged only if the write (W) command is received (assuming for illustrative purpose that read (R) commands have relatively little effect on site fatigue and adjacent site disturbance). Illustratively, one site exchange method utilizes ($1 \leq R \leq 10$), and where R is a "uniform discrete" random number, and $F=10$ as the specific integer to be compared with the pseucorandom number generated by meand 32. Thus, the R/W decode means 37 is set to recognize only a write (W) command for energization of comparator means 35 (as shown by the dotted line and W in FIG. 2). It should be understood that, dependent upon the characteristics of the particular memory storage media utilized, only read commands or both read and write commands may be equally as well decoded by means 37 for energization of index line 31 and comparator 35, in addition to the illustrated decode-write-command-only mode of operation.

Upon receipt of a write (W) command on line 16c, R/W decode means 37 energizes index line 31 to request a new PSN from generator means 32, via line 33. The newly presented PSN is coupled to the R input of comparator 35 and compared with the number F.

If comparator means 35 finds R not equal to F, a NO condition obtains whereby line 38 is energized to cause address means 26 to couple the first input 26a ($M_1$ output 24d) to memory means BZ input 10b. Simultaneous with the issuance of the write command on line 16c, the host computer presents the logical address at which data, issuing via the data I/0 port 16a and temporarily stored in data buffer means 21, is to be written. This logical address is received in buffer means 22 and presented to first input 24a of address correspondence memory means $M_1$. In the absence of an energizing level at LOAD input 24c (operation explained hereinbelow), the logical address bits at input 24a are received as the memory address and access the A bits of the corresponding physical address previously stored in memory means $M_1$, for presentation at memory output 24d. These A bits are presented to memory means BZ input 10b via the now-enabled path through address switch means input 26a and, being present simultaneously with the write command at R/W input 10d (and without the energization of the altered operation code input 10c, as XTRL line 40 is coupled to the non-deenergized YES output of comparator 35) commands memory controller means 14 to obtained the data block stored in buffer means 21 and to write the same block at the physical address, in tube 12, corresponding to the logical address LY sent by the host computer.

if comparator means 35 finds R equal to F, a YES condition obtains whereby line 39 is energized to cause address switch means 26 to couple its additional input 26b (temporary-address-storage memory means $M_2$ output 28b) to memory means BZ input 10b. Simultaneously, the XTRL line 40 is energized to cause AO generator means 42, receiving the W command at its input 42a, to energize its output 42b and the altered op. code input 10c of the memory means, to temporarily suspend physical address access operations.

The logical address, e.g. LA, requested by the host computer and stored in buffer means 22 is presented to memory means $M_1$ input 24a for transformation therein into the previously assigned corresponding physical address, e.g. BA (FIG. 1a). The physical address appearing at memory means $M_1$ output 24d is coupled into temporary address storage memory means $M_2$. The energization of control line 39 acts to generate the STR strobe signal at input 28c of memory means $M_2$, whereby the physical address, e.g. BA, to be erased is stored in a first register (A bits wide) of memory means $M_2$. This address also appears on output 28b and thus at address (BZ) input 10b. Similarly, the data to be stored in LA is transferred from the host computer 16 into data buffer means 21 via bidirectional data I/O line 10a. Data site management control means 30 now causes AO generator means 42 to issue an altered op. code instructing memory control means 14 to erase the data block stored at the physical address, e.g. BA.

Data site management control means now issues a second control signal on control line 39 to cause memory means $M_2$ to present at its output 28b the A bits (previously stored in the second A-bit-wide register thereof) of the physical address of the previously empty data block. The physical address appears at address switch means input 26b and, additional control input 26c thereof being energized by control line 39, is routed to address BZ input 10b to access the previously prepared spare storage site in the memory media. The data block stored in data buffer means 21b is now transferred therefrom into memory control means 14, via data I/O line 10a, and is thence written into the spare data block site e.g. BS, upon issuance of a third altered op. code by generator means 42 under control of data site management control means 30. Simultaneously, data site management control means 30 energizes LOAD input 24c of memory means $M_1$ to load the physical address of the data block, e.g. BS, now containing the data corresponding to the logical address, e.g. LA, stored in buffer means 22, which physical address is presented to memory means $M_1$, auxiliary input 24b by the output of memory means $M_2$.

While a single exchange may be utilized, it is preferable to perform a second exchange to write new data into the original data block, e.g. BA. Thus, data site management control means 30 next energizes index line 45 of the next-logical-address memory means $M_3$ to obtain the logical address NLA of the next data block, e.g. at physical address BS+1 (FIG. 1b), to be moved. Control means 30 receives the NLA address on line 46 and routes this address via the NLA' line 47 to input 24e of memory means $M_1$ to obtain the corresponding physical address BS+1, which physical address appears at memory means output 24d. This next physical address is temporarily stored in the third A-bit-register of memory means $M_2$, and control means 30 energizes generator means 42 to issue a third altered op. code to input 10c of the memory means to facilitate reading of the data from the block at physical address BS+1 for storage in data buffer means 21. Upon storage thereof, control means 30 enables generator means 42 for the issuance of a fourth sequential op. code to command memory control means 14 to erase the data block at physical address BS+1. This physical address now becomes the new temporarily-vacated spare data block in the memory means.

Control means 30 then energizes control line 39 and LOAD input 24c while maintaining the physical address, e.g. Lp, of the data from the just-erased storage site, at input 24e. Upon receipt of the STR signal at its input 28c, memory means $M_2$ reads out the first stored address (the physical address of the first data block array, e.g. BA) to auxiliary input 24b for establishing the new correspondence between the next logical address, e.g. Lp, the physical address, e.g. BA, at which the corresponding block of data is now stored. Thereafter, temporary address storage means $M_2$ shifts the physical address of the now-empty data block (BS+1) to the A-bit-wide register holding the "next-spare-address-site," for use in the next exchange operation if a subsequent write command, appearing on line 16c, causes generation of a number R equal to the selected number F. Control means 30 energizes generator means 42 to issue a fourth altered op. code to input 10c of the memory means to facilitate the recording of data from buffer means 21 into data site BA of Memory Means 14. The exchange operation is now complete, with the first logical address LA corresponding to the physical address BS and the next subsequent randomly-selected logical address LP corresponding to the original physical address BA with the unoccupied physical address shifting from the initial physical address BS to the final spare physical address BS+1.

In summary, immediately prior to the address rotation process, the logical address LA corresponded to a physical address BA and the logical address LP corresponded to a physical address BS+1. An erased spare physical address BS was stored in memory means $M_2$. After the site rotation cycle, logical address LA corresponds, both in correspondence memory $M_1$ and in the physical site within storage media 12 addressed thereby, to physical address BS, while logical address LP corresponds to physical address BA and the next spare address site is now BS+1, which next spare site physical address is stored in a register of memory means $M_2$.

It should be understood that memory means $M_3$ may be a read-only memory device, preloaded with the sequence of logical moves to be facilitated, which sequence is selected to achieve a uniform rotation of data through the memory media. Similarly, memory means $M_3$ may be a volatile memory means loaded from a tape or other input device or having its contents generated, as required, by an algorithm in either host computer 16 or memory controller means 10.

As address correspondence memory means $M_1$ is volatile, a power failure may result in the loss of correspondence information between logical addresses and physical addresses. If loss of correspondence occurs, correspondence data can be recovered by reading each of the physical address sites to recover the logical address which, preferably, will be stored as a portion of the heading code for each data block. Data recovery may be facilitated by control means 30 generating a read command (via interconnections not shown for reasons of simplicity) to R/W input 10d to access each physical address in sequence to extract the logical address, made available at a stored logic address output 10e, for that phsical address and entering the correspondence information into memory means $M_1$. The full address correspondence refresh cycle may be carried out under control of means in control means 30 or memory controller means 10, whereby the host computer 16 may utilize the required time interval to re-establish any base programming and the like required after unintentional shutdown. It should be understood that loss of sequence in pseudo-random number generator means 32 or in next-logical-address memory means $M_3$ will not have a deleterious effect upon the exchange process; if desired, a power-up sequence may automatically return the index of memory means $M_3$ to an initial value, although initialization at a random point may be beneficial in the desired physical address randomization method, dependent upon the particular memory media utilized.

Figure 3:
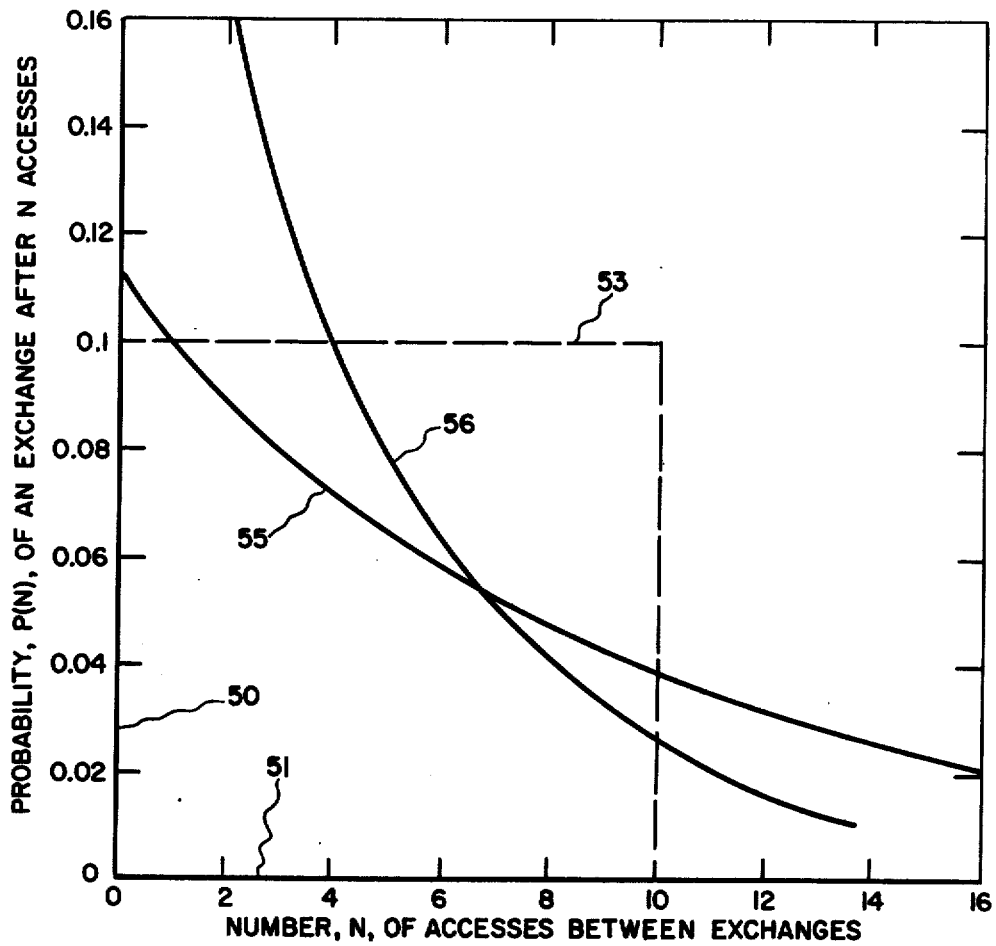
FIG. 3 is a graph comparing the probability of a site exchange at various accesses thereof, for alternate preferred distributions.

Referring now to FIG. 3, the probability of a physical address exchange after a number N accesses to that physical address is plotted along ordinate 50 and the number N of accesses to the memory system after the last exchange is plotted along abscissa 51. If the next exchange is chosen to occur after R accesses to the system where R is generated utilizing the above-described method wherein the pseudo-random number R is between 1 and 10, the probability P[N] of an exchange is constant, with P[N]=0.1 (a preferred value) for any number of accesses between 1 and 10, as illustrated by probability curve 53, in broken line. This is the simplest random exchange method and it also permits knowledge of when the next exchange will occur. A somewhat lower average frequency of exchange may be utilized to prevent unacceptable site distrubance, without the decrease in memory performance caused by the more frequent exchanges occasioned by utilization of curve 53, if a geometric distribution is utilized whereby an address exchange operation occurs on the Nth axis with a probability $P[N]=(1/S^{-1})N-1$. Geometric distribution probabilities P[N] are respectively plotted for S=5 and S=10 in curves 55 and 56, respectively, in FIG. 3. For S=5, the geometric distribution has the same average number of accesses between exchanges as the broken line curve; for S=10, the geometric distribution requires fewer accesses between exchanges and has the same distribution as the method previously disclosed, whereby large and sequentially repetitive access of a selected physical address will result in a larger probability of the exchange thereof to prevent unacceptable site disturbance therein. The geometric distribution may be facilitated by the method previously disclosed or by having number generator means 32 (FIG. 2) generate a random deviate U, where (0 < U ≦ 1), after an exchange has occurred; calculating the function $E=(-Sln(U)+1)$; rounding the calculated function to the next lowest integer N; and counting the number of commanded accesses (read, write or read/write) until N accesses have occurred; and then performing another exchange operation. This later method has the advantage that the number of accesses to the next exchange is known at the time of the previous exchange. This information can be used to improve the system operation by preparing for the next exchange during memory-inactive time intervals in the systems cycle.

Figure 2A:
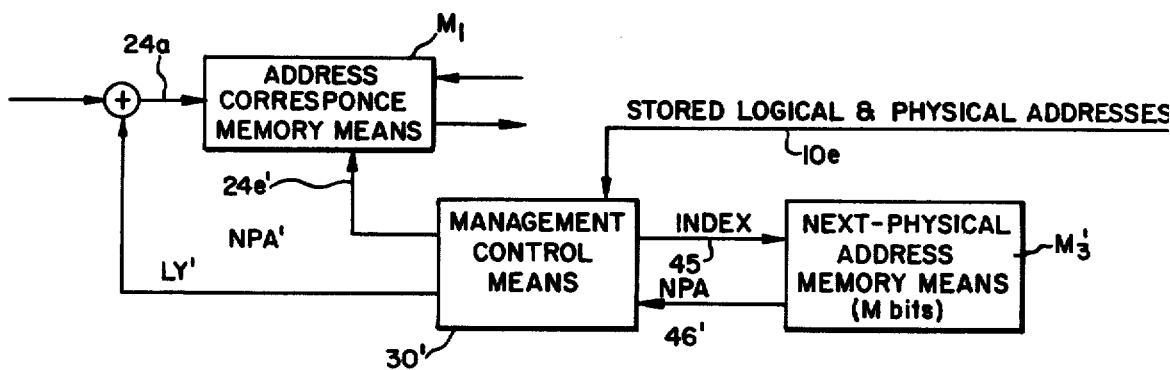
FIG. 2a is a partial block diagram of apparatus for accomplishing randomization of memory site usage in an alternative manner.

Advantageously, the exchange of stored data is preferably accomplished by randomly selecting a next physical address (rather than a next-logical-address) from memory means $M_3$ as the "donor" data block for the second exchange. Substantially random selection of a next-physical-address assures that all of the data blocks are substantially uniformly re-written without regard to uneven logical addressing by the host computer (as when a commonly used data block is repeatedly accessed and exchanged, while a rarely used data block is seldom, if ever, exchanged). Referring now to FIG. 2a, completion of the first data block exchange (e.g. contents of BA into BS, with logical address LA) of a pair, responsive to receipt of a command on R/W line 16c, causes generation of an index signal on line 45 to a next-physical-address (NPA) memory means $M_3'$, which contains all possible physical addresses (rather than logical addresses) in substantially random order. Memory means $M_3'$ now requires M bits, as the number of physically addressed data blocks in memory 10 is predetermined, even if several memory means are parallel-coupled to one host computer. The NPA memory means $M_3'$ thus presents a next-physical-address (NPA) (e.g. BS+1) via line 46', and gating circuitry and control means 30, to a next-physical-address (NPA') input 24e' of the address correspondence memory means $M_1$. This NPA' address is simultaneously stored in the third A-bit wide block of memory means $M_3$ and is transmitted, via address switch means 26, to the address (BZ) port 10b of memory means 10.

Receipt of the NPA' address by memory controller means 14 causes the data stored in the selected block (e.g. BS+1) to be read into data buffer means 21 and also causes the header data of that selected block to appear at the stored-logical-and-physical-addresses output 10e of the memory means. The header data of each block includes both the present physical address (e.g. BS+1) and the logical address (e.g. LP) presently assigned to that data block; control means 30' is configured to extract the present logical address fromm the header data and couple this logical address (LY'), via a logical OR connection, to the logical address input 24a of address correspondence memory means $M_1$. It should be understood that the original logical address input (e.g. LA) held in address buffer 22 is suppressed upon presentation of the next-logical-address LY'. The new logical address (e.g. LP) at address input 24a accesses the corresponding storage sites within memory means $M_1$, while the physical address of the first-called data block (e.g. BA) previously stored in the first register of memory means $M_2$, is presented at auxiliary input 24b for storage in the random access memory means $M_1$. Thus, the physical address (e.g. BA) tow to which data is now to be moved, is loaded into memory means $M_1$ in correspondence with the logical address (e.g. LP) of the second data block physical address to be exchanged. Having established the new logical-to-physical address correspondence, the data previously stored in buffer means 21 is written into the memory media 12 at the new physical address (NPA) thereof (e.g. BA) and the original physical address thereof (e.g. BS+1) is erased (FIG. 1c) to complete the exchage cycle.

While the present invention has been described with reference to several preferred methods and apparatus facilitating these methods, many variations and modifications will now occur to those skilled in the art.

It is our intent, therefore, to be limited not by the scope of the present disclosure herein, but only by the scope of the appending claims.

What is claimed is:

1. A method for randomizing memory site usage in a rewritable memory device containing a plurality of data blocks each having a different physical address within the memory device, said memory device having a memory address port at which an address code for accessing a desired one of said plurality of data blocks may appear, said method comprising the steps of:
   a. randomly selecting at least one physical address within the memory device to each designate an initially empty temporary storage data block;
   b. pairing each of a plurality of logical address codes presentable to the device with an address code presentable at the memory address port for a physical address of one of the remaining data blocks;

c. storing each pair of logical address and physical address in an address correspondence memory means;

d. generating a substantially random number responsive to each of at least one selected type of data access command to said memory device to access data in a data block therein having a first physical address corresponding to a first logical address simultaneously presented to the auxiliary correspondence memory means;

e. comparing the substantially random number to a preselected fixed number to generate an exchange enable signal if said numbers are equal;

f. exchanging the data in the data block having the first physical address with the data in one temporary storage data block having a second physical address, responsive to the exchange enable signal being present; and g. modifying the auxiliary correspondence memory means to contain the second physical address in correspondence with the first logical address.

2. A method as set forth in claim 1, further comprising the steps of:

h. providing a substantially randomly selected list of all possible logical addresses receivable at said memory device;

i. selecting a second logical address from said list;

j. presenting the second logical address to the address correspondence means to provide a third physical address; and k. exchanging the data stored in the data block having the third physical address with the data stored in the now-empty data block having the first physical address.

3. A method as set forth in claim 2, wherein step (i) comprises the step of selecting the second logical address to be the logical address immediately following said first logical address in said list.

4. A method as set forth in claim 2, wherein step (k) further comprises the steps of:

removing the data stored in the data block having the third physical address;

re-writing the removed data into the data block having the first physical address; and erasing the data block having the third physical address.

5. A method as set forth in claim 1, further comprising the steps of:

h. providing a substantially randomly selected list of all possible physical addresses accessible in said memory device;

i. selecting a third physical address from said list;

j. obtaining a second logical address associated with the third physical address;

k. establishing correspondence in the address correspondence means between the now-empty first physical address and the second logical address; and l. exchanging the data stored in the data block having the third physical address with the data stored in the now-empty data block having the first physical address.

6. A method as set forth in claim 5 wherein step (i) comprises the step of selecting the third physical address to be the physical address immediately following said second physical address in said list.

7. A method as set forth in claim 5, wherein step (1) further comprises the steps of:

removing the data stored in the data block having the third physical address;

re-writing the removed data into the data block having the first physical address; and erasing the data block having the third physical address.

8. A method as set forth in claim 1, wherein step (f) comprises the steps of:

removing the data stored in the data block having the first physical address;

re-writing the removed data into the data block having the second physical address; and erasing the data block having the first physical address.

9. A method as set forth in claim 1, wherein step (d) includes the steps of: selecting a maximum number F; and pseudorandomly generating an integer R between 1 and F, responsive to the receipt of each of the at least one selected type of data access command.

10. A method as set forth in claim 9, wherein step (e) includes the steps of: comparing the pseudorandomly generated integer R with the number F; and generating the exchange enable signal only if $R = F$.

11. A method as set forth in claim 10, wherein F is selected to equal 10.

12. A method as set forth in claim 1, wherein steps (d) and (e) include the steps of:

selecting a geometric distribution constant S;

generating, after each exchange occurs, a random deviate U having a value greater than zero and not greater than one;

calculating the value of the function E, where $E = (-Sln(U) + 1)$;

rounding the value of the function E to the nearest integer N;

counting the number of the at least one selected type of data address commands received by said memory device; and generating the exchange enable signal when the number of selected access commands equals the integer N.

13. A method as set forth in claim 12, wherein $S = 5$.

14. A method as set forth in claim 12, wherein $S = 10$.

15. A method as set forth in claim 12, wherein said at least one selected type of data access command is a write-data-in-memory command.

16. A method as set forth in claim 1, wherein said at least one selected type of data command is a write-data-in-memory command.

17. Apparatus for randomizing site usage in a re-writable memory device containing a plurality of data blocks each having a different physical address within the memory device, said memory device having a memory address port at which an address code for accessing a desired one of said plurality of said data blocks may appear, comprising:

first means for storing the address code of each physical address within said device, at least one physical address therein being selected as an initially-empty temporary storage data block, each remaining physical address being stored in correspondence with one of a plurality of logical addresses presentable as the address code to said memory device;

second means for temporarily storing a first physical address presented by said first means responsive to a first logical address being presented thereto and for temporarily storing a second physical address of a temporary storage data block;

third means for temporarily storing a block of data at least during an exchange operation;

fourth means for switching a selected one of the first and second physical addresses stored in said second means to said memory address port respectively responsive to one of first and second control signals;

fifth means for generating a substantially random one of a predetermined field of numbers responsive to a first index signal;

control means comprising sixth means responsive to at least one selected type of memory access command, accompained by a first logical address, for generating said first index signal;

seventh means for respectively generating said first and second control signals if said substantially random number is respectively different from and equal to a predetermined number in said field;

said fourth means switching said first physical address immediately to said memory address port if said first control signal is present;

said fourth means switching said second physical address to said memory address port only after switching said first physical address thereto if said second control signal is present; and eighth means responsive to said second control signal for issuing a sequence of alternate operation codes to said memory device to cause the data stored in the first physical address presented to said memory address port to be exchanged with the data stored in the second physical address presented thereto;

said control means causing said second physical address to be placed into said first means in correspondence.

18. Apparatus as set forth in claim 17, wherein said eighth means comprises:

means responsive to said second control signal for causing the block of data stored at said first physical address to be transmitted to said third means;

means responsive to said second control signal causing said second physical address to appear at said memory output port for causing the writing of the block of data stored in said third means into said second physical address; and means responsive to the completion of the writing in said second physical address for erasing the data stored at said first physical address.

19. Apparatus as set forth in claim 17, wherein said sixth means is responsive to a write-data-in-memory access demand.

20. Apparatus as set forth in claim 17, further comprising ninth means for storing a substantially randomly arranged list of all permissible logical addresses, said ninth means providing a second logical address responsive to receipt of a second index signal;

said control means adapted to transmit said second index signal to said ninth means only if said second control signal is present;

said first means receiving said second logical address to provide a physical address corresponding thereto to said second means;

said second means including means for temporarily storing said third physical address therein; and said eighth means adapted to issue another sequence of alternate operation codes to said memory device to cause said second means to present said third and second physical addresses in sequence at said memory address port to enable exchange of the data stored in said third physical address with the data stored in the second physical address.

21. Apparatus as set forth in claim 20, wherein said second logical address is the next logical address immediately following said first logical address in the list contained in said ninth means.

22. Apparatus as set forth in claim 17, further comprising ninth means for storing a substantially randomly arranged list of all permissible physical addresses, said ninth means providing a third physical address responsive to receipt of a second index signal;

said control means adapted to transmit said second index signal to said ninth means only if said second control signal is present;

said control means being adapted to obtain a second logical address corresponding to said third physical address and to provide said second logical address to said first means to establish a correspondence in said first means between said second logical address and said first physical address;

said second means including means for temporarily storing said third physical address therein; and said eighth means adapted to issue another sequence of alternate operation codes to said memory device to cause said second means to present said third and first physical addresses in sequence at said memory address port to enable exchange of the data stored in said third physical address with the data stored in the first physical address.

23. Apparatus as set forth in claim 22, wherein said third physical address is the next physical address immediately following said second physical address in the list contained in said ninth means.

24. Apparatus as set forth in claim 17, wherein said fifth means is adapted to pseudo-randomly generate a number R from a field of numbers between number 1 and a preselected maximum number F.

25. Apparatus as set forth in claim 17, wherein said fifth means comprises means for generating a random deviate U, wherein $0 < U \leq 1$, said random deviate being generated after an exchange operation is completed; means for calculating the value of a function $E=(-Sln(U)+l)$, wherein $S$ is a predetermined geometric distribution constant; means for rounding the value of the calculated function $E$ to the next lowest integer $N$; and means responsive to the number of said at least one type of data access command for providing said second control signal when N accesses have occurred to enable another exchange operation.

* * * * *